(12) United States Patent
Uemura

(10) Patent No.: US 6,726,765 B2
(45) Date of Patent: Apr. 27, 2004

(54) PROTEIN CRYSTALLIZATION APPARATUS AND PROTEIN CRYSTALLIZATION METHOD

(75) Inventor: Masaru Uemura, Hyogo-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/119,895

(22) Filed: Apr. 11, 2002

(65) Prior Publication Data

US 2002/0183487 A1 Dec. 5, 2002

(30) Foreign Application Priority Data

Apr. 12, 2001 (JP) .......................... 2001-151709

(51) Int. Cl.[7] ............................... C30B 7/14
(52) U.S. Cl. ..................... 117/68; 422/245.1
(58) Field of Search ................. 117/68; 422/254.1

(56) References Cited

FOREIGN PATENT DOCUMENTS

| JP | 6-321700 | 11/1994 |
| JP | 7-89798 | 10/1995 |
| JP | 2000-79900 | 3/2000 |

OTHER PUBLICATIONS

Patent Abstracts of Japan, JP 06 321700, Nov. 22, 1994.
A. McPherson, Journal of Physics D: Applied Physics, vol. 26, No. 8B, XP–000387619, pp. B104–B112, "Virus and Protein Crystal Growth on Earth and in Microgravity", Aug. 14, 1993.

*Primary Examiner*—Felisa Hiteshew
(74) *Attorney, Agent, or Firm*—Oblon, Spivak, McClelland, Maier & Neustadt, P.C.

(57) ABSTRACT

A protein crystallization apparatus is comprised of a vessel supporting section and a rotating unit. A vessel is detachably fixed to the vessel supporting section. The rotating unit rotates the vessel supporting section around first and second rotation axes. The vessel is comprised of a vessel section having an opening; a sealing section which seals said opening of said vessel section; an absorption member which is provided in the vessel section and in which precipitant solution is absorbed; and a button provided apart from the absorption member to hold protein solution. Precipitant evaporates and diffuses in an inside of the vessel section while the vessel supporting section is rotated. The precipitant is absorbed by the protein solution and a protein crystal is precipitated.

15 Claims, 5 Drawing Sheets

| ITEMS | SEALED VESSEL 2 ROTATION | SEALED VESSEL 2 NON ROTATION |
|---|---|---|
| SHAPE | ISOTROPIC | ANISOTROPIC |
| DENSITY (g/ml) | 1.255 | 1.245 |
| CRYSTAL STRUCTURE | TETRAGONAL | TETRAGONAL |
| POINT GROUP | $P4_32_12$ | $P4_32_12$ |
| UNIT LATTICE (Å)  A AXIS | 78.17 | 78.35 |
| C AXIS | 37.30 | 37.12 |
| MOSAIC INDEX | 0.2 | 0.2 |
| HIGHEST RESOLUTION (Å) | 1.44 | 1.49 |

Fig. 5

| ITEMS | | SEALED VESSEL 2 ROTATION | SEALED VESSEL 2 NON ROTATION |
|---|---|---|---|
| SHAPE | | ISOTROPIC | ANISOTROPIC |
| DENSITY (g/ml) | | 1.255 | 1.245 |
| CRYSTAL STRUCTURE | | TETRAGONAL | TETRAGONAL |
| POINT GROUP | | $P4_32_12$ | $P4_32_12$ |
| UNIT LATTICE (Å) | A AXIS | 78.17 | 78.35 |
| | C AXIS | 37.30 | 37.12 |
| MOSAIC INDEX | | 0.2 | 0.2 |
| HIGHEST RESOLUTION (Å) | | 1.44 | 1.49 |

PROTEIN CRYSTALLIZATION APPARATUS AND PROTEIN CRYSTALLIZATION METHOD

BACKGROUND OF THE INVENTION

1. Field of the Invention

The present invention is relates to a protein crystallization apparatus and a protein crystallizing method.

2. Description of the Related Art

The technology for growing protein crystal is important in protein structural analysis. The structure of the protein crystal can be identified by using an analysis method like X-ray diffraction. The identification of the structure of the protein crystal is indispensable especially for the development of medicine including the protein crystal.

As the methods of crystallizing protein, a method of crystallizing the protein under a still condition is known (still condition batch method, a liquid-liquid (free boundary) diffusion method, a small amount dialysis method and so on). In the method of crystallizing the protein by decreasing the solubility of the protein, protein solution and buffer solution containing precipitant are enclosed in the same vessel. When the precipitant diffuses into the protein solution, the solubility of the protein decreases and the protein is crystallized.

However, in the conventional method of crystallizing the protein by decreasing the solubility of the protein under the still condition, it is difficult to grow the protein crystal isotropically.

Moreover, the crystallization of the protein is slow in the growth speed of the crystal. For this reason, it takes a long time to grow the protein crystal. This is one factor to obstruct the improvement in efficiency of the protein structural analysis.

In conjunction with the above description, a protein crystallizing method is known in Japanese Laid Open Patent Application (JP-A-Heisei 6-321700). In the conventional protein crystallizing method, protein gel 105 containing protein, precipitant gel 106 containing precipitant, and buffer solution gel 107 containing only buffer solution are put into a vessel 101, as shown in FIG. 1. In this way, gel is used to supply necessary material for the growth of a protein crystal in the conventional protein crystallizing method. It is described in the above reference that the use of the gels is a purpose to make convection small as much as possible. In the vessel 101, a sandwich structure is formed in which the precipitant gel 106, the buffer solution gel 107, the protein gel 105, the buffer solution gel 107 and the precipitant gel 106 are stacked in order. The vessel 101 is reversed up and down while the protein crystal grows. The precipitant contained in the precipitant gel 106 passes the buffer solution gel 107 and diffuses into the protein gel 105 in the conventional protein crystallizing method. The present invention does not need gelatinization and is fundamentally different technology from the conventional protein crystallizing method.

SUMMARY OF THE INVENTION

Therefore, an object of the present invention is to provide a protein crystallizing technique in which it is possible to grow a protein crystal more isotropically.

Another object of the present invention is to provide a protein crystallizing technology in which it is possible to promote the growth of the protein crystal.

In a protein crystallization apparatus includes a vessel supporting section and a rotating unit. A vessel is detachably fixed to the vessel supporting section. The rotating unit rotates the vessel supporting section around first and second rotation axes. The vessel contains protein solution and a protein crystal grows while the vessel supporting section is rotated.

The rotating unit may include a first rotating unit which rotates the vessel around the first rotation axis, and a second rotating unit which rotates the first rotating unit around the second rotation axis. In this case, the first rotating unit may include an inner frame which supports the vessel supporting section; and a first motor which rotates the inner frame. Also, the second rotating unit may include an outer frame to which the first rotating unit is mounted; and a second motor which rotates the first rotating unit.

The rotating unit rotates the vessel supporting section to meet the following differential equations (1), $$\dot{\phi} = \frac{A}{|\sin\phi|} \qquad (1)$$

$$\dot{\theta} = \frac{B}{|\sin\phi|}$$

where φ is an angle between a predetermined direction perpendicular to the first rotation axis and the outer frame, and θ is an angle between a predetermined direction perpendicular to the second rotation axis and the inner frame, and A and B are selected such that 2 m/n (m and n are positive integers) is not an integer to minimum n and m meeting a relation of A:B=n:m.

Also, it is desirable that the rotating unit rotates the vessel supporting section such that gravity is applied to the vessel isotropically.

Also, the vessel may include a vessel section having an opening; a sealing section which seals the opening of the vessel section; an absorption member which is provided in the vessel section and in which precipitant solution is absorbed; and a button provided apart from the absorption member in the vessel section to hold the protein solution. Precipitant evaporates from the absorption member and diffuses in an inside of the vessel section. The precipitant is absorbed by the protein solution and the protein crystal is precipitated.

In another aspect of the present invention, a protein crystallizing method is achieved by (a) providing a vessel to a vessel supporting section; by (b) rotating the vessel supporting section around first and second rotation axes; and by (c) growing a protein crystal while the vessel supporting section is rotated, wherein the vessel contains protein solution.

The (b) rotating step may be achieved by rotating the vessel around the first rotation axis; and by rotating the first rotating unit around the second rotation axis.

Also, the (b) rotating step may be achieved by rotating the vessel supporting section to meet the following differential equations (1), $$\dot{\phi} = \frac{A}{|\sin\phi|} \qquad (1)$$

$$\dot{\theta} = \frac{B}{|\sin\phi|}$$

where φ is a rotation angle with respect to the first rotation axis and θ is an rotation angle with respect to the second rotation axis, and A and B are selected such that 2 m/n (m and n are positive integers) is not an integer to minimum n and m meeting a relation of A:B=n:m.

Also, the (b) rotating step may be achieved by rotating the vessel supporting section such that gravity is applied to the vessel isotropically.

Also, the protein crystallization method may further include: providing the vessel. The vessel includes a vessel section having an opening; a sealing section which seals the opening of the vessel section; an absorption member which is provided in the vessel section and in which precipitant solution is absorbed; and a button provided apart from the absorption member in the vessel section to hold the protein solution. Precipitant evaporates from the absorption member and diffuses in an inside of the vessel section. The (d) growing step may be achieved by evaporating the precipitant from the absorption member; by absorbing the precipitant by the protein solution; and by precipitating the protein crystal.

BRIEF DESCRIPTION OF THE DRAWINGS

FIG. 5 is a table showing the difference between lysozyme crystal with rotation of the vessel and lysozyme crystal with no rotation of the vessel in characteristics.

DESCRIPTION OF THE PREFERRED EMBODIMENTS

Hereinafter, a protein crystallization apparatus according to an embodiment of the present invention will be described in detail with reference to the attached drawings.

Figure 1:
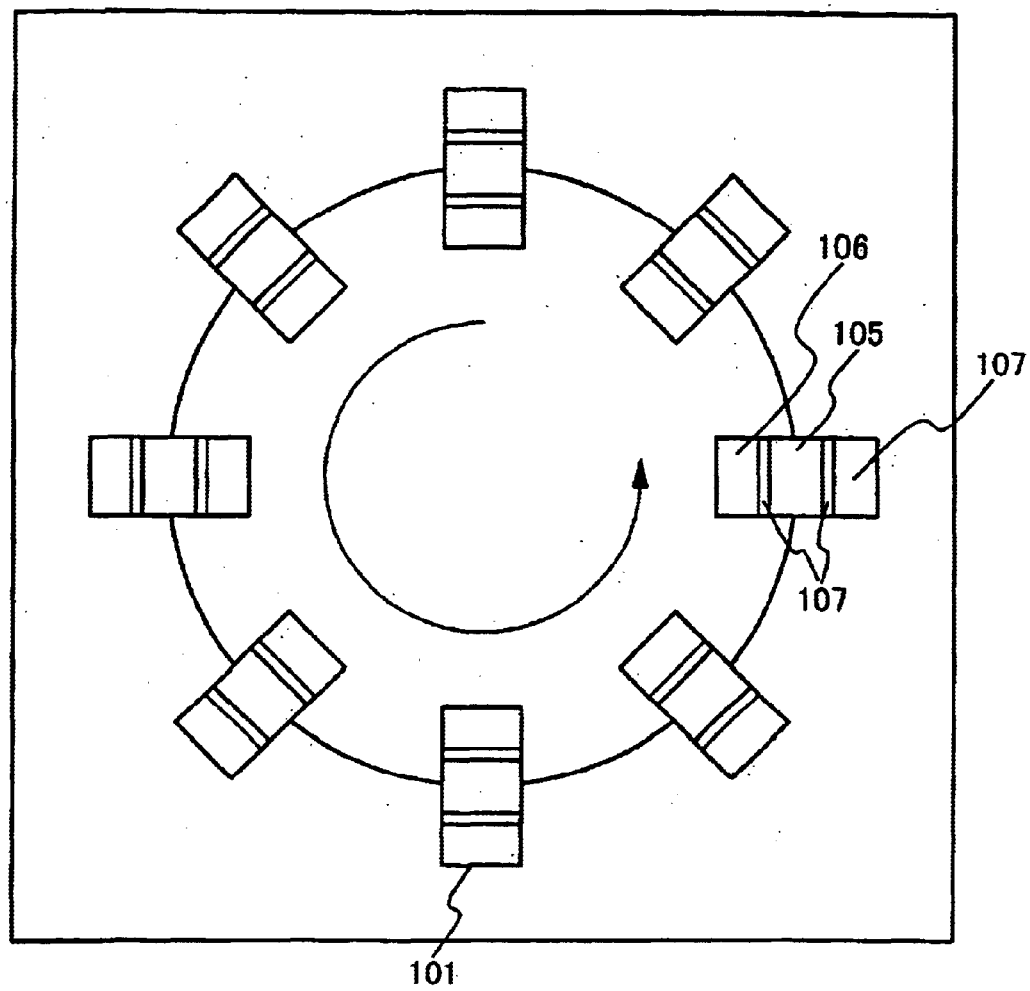
FIG. 1 shows a conventional protein crystallizing method.
Figure 2:
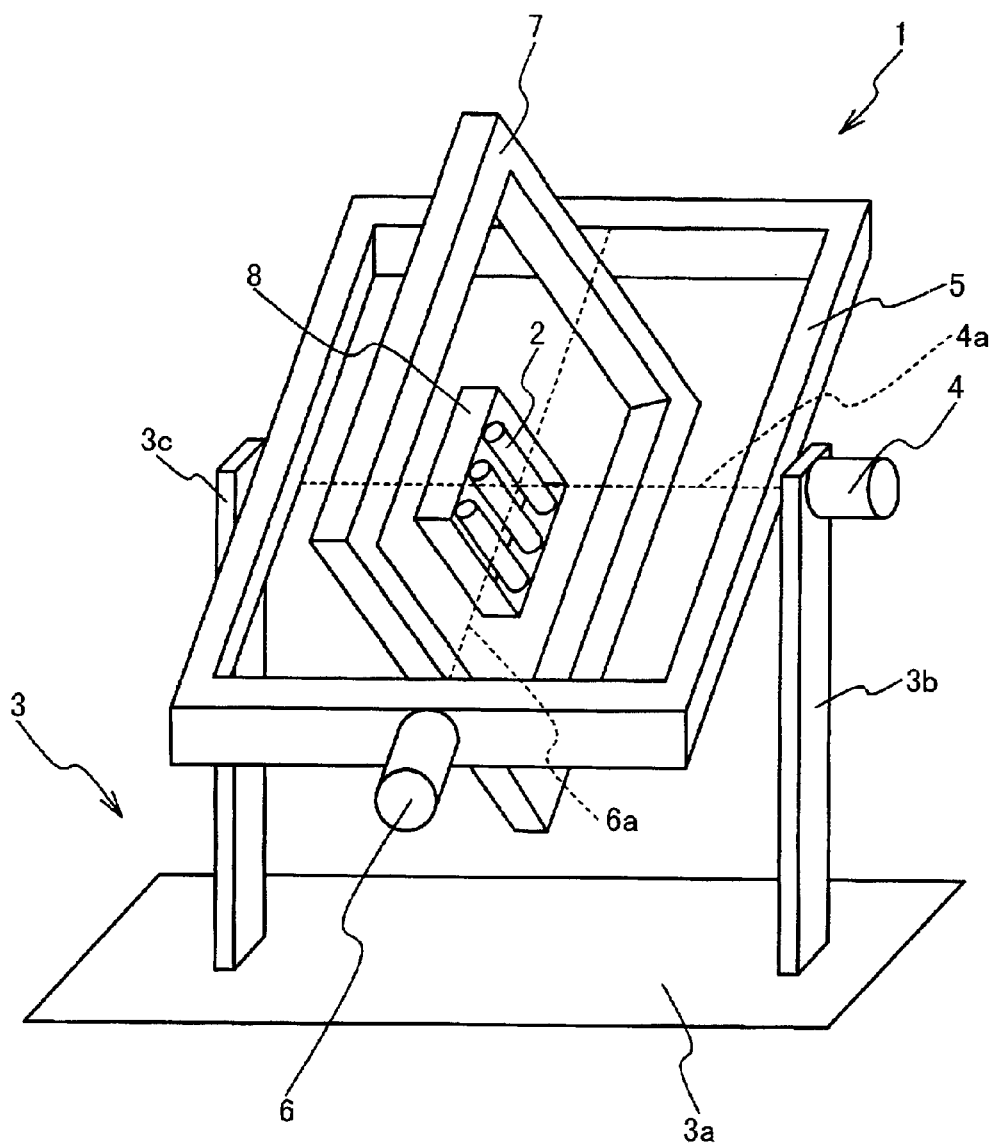
FIG. 2 shows a protein crystallization apparatus according to an embodiment of the present invention.

FIG. 2 shows the protein crystallization apparatus according to the embodiment of the present invention. The protein crystallization apparatus is comprised of a three-dimensional klinostat 1 and a vessel 2. Protein crystal is grown in the vessel 2.

The three-dimensional klinostat 1 contains a main unit 3, a motor 4, an outer frame 5, a motor 6, an inner frame 7 and a vessel supporting section 8. The main unit 3 contains a bottom 3a and legs 3b and 3c. The legs 3b and 3c are connected with the bottom 3a. The motor 4 is provided for the leg 3b. The outer frame 5 is connected with the motor 4. The motor 4 has the rotation axis 4a and rotates the outer frame 5. The motor 6 is provided for the outer frame 5. The inner frame 7 is connected with the motor 6. The motor 6 has the rotation axis 6a and rotates the inner frame 7. The rotation axis 6a is substantially orthogonal to the rotation axis 4a.

The vessel supporting section 8 is connected with the inner frame 7. The vessel supporting section 8 is rotated at the same time as the inner frame 7. The vessel supporting section 8 supports the above-mentioned vessel 2. When the outer frame 5 and the inner frame 7 are rotated, respectively, the vessel is rotated to have two rotation axes. At this time, the vessel 2 is situated in the neighborhood of the intersection of the rotation axis 4a and the rotation axis 6a.

Figure 3A:
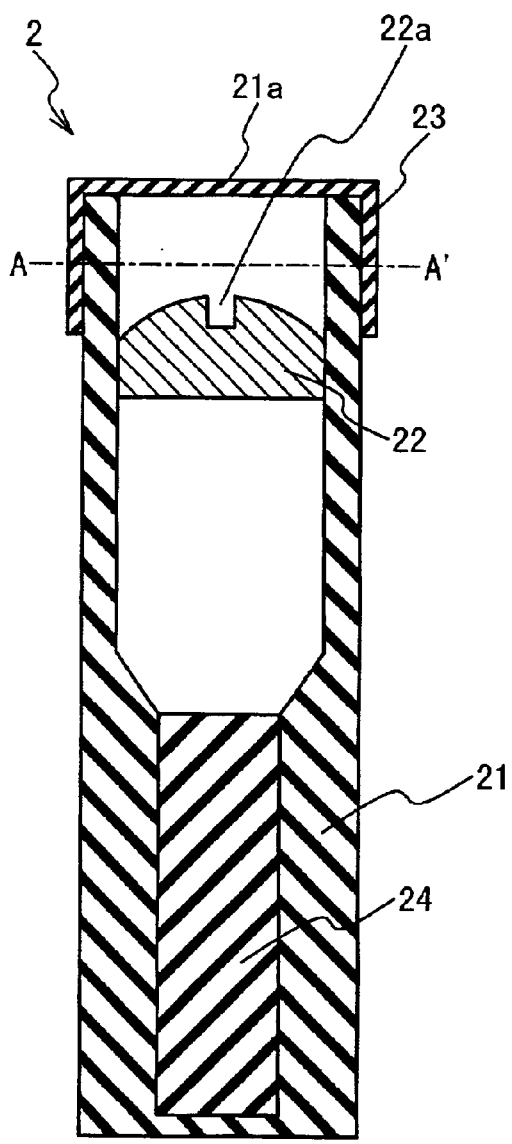
FIGS. 3A and 3B show the structure of a vessel.
Figure 3B:
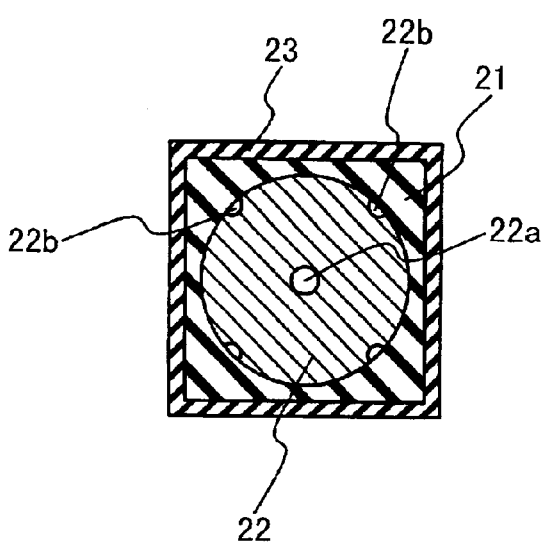

FIGS. 3A and 3B shows the structure of the vessel 2. FIG. 3A is a vertical cross sectional view of the vessel 2, and FIG. 3B is a cross section view of the vessel 2 along the line A–A' in FIG. 3A. The vessel 2 contains a vessel main unit 21, a button 22 and a seal 23.

As shown in FIG. 3A, a hollow 22a is provided for an upper surface of the button 22. A little protein solution in which protein is dissolved is put into the hollow 22a. The quantity of protein solution is typically about 20 $\mu$l. The protein solution having fluidity is used. The protein solution put into the hollow 22a is held in the hollow 22a with surface tension. Therefore, even if the vessel 2 is rotated, the protein solution never spills out from the hollow 22a. In this way, the mechanism for supporting the protein solution is simplified very much. Moreover, as shown in FIG. 3B, gaps 22b are provided to penetrate the button 22 from the upper surface of the button 22 to the lower surface thereof.

Cellulose fiber 24 is stored inside the vessel main unit 21. Precipitate solution in which a precipitant has been dissolved is absorbed into the cellulose fiber 24. Just a part of the precipitant absorbed into the cellulose fiber 24 evaporates through the gaps 22b and diffuses into the protein solution put in the hollow 22a. When the precipitant diffuses into the protein solution, the solubility of the protein reduces and the protein is crystallized from the protein solution.

The cellulose fiber 24 supports the precipitant solution such that the precipitant solution never exudes when the vessel 2 is rotated. This prevents contact of the precipitant solution with the protein solution put in the hollow 22a when the vessel 2 is rotated.

An opening 21a is provided for the vessel main unit 21. The protein solution and the precipitant solution are put into the vessel 2 from the opening 21a. The seal 23 seals up the opening 21a to keep the inside of the vessel 2 in the sealed state.

Next, a growing procedure of protein crystal will be described.

First, the protein solution and the precipitate solution are put in the vessel 2. The protein solution is put in the above-mentioned hollow 22a. Moreover, the precipitant solution is absorbed into the cellulose fiber 24. Subsequently, the opening 21a is sealed up with the seal 23 and the vessel 2 is sealed. Subsequently, the vessel 2 is installed in the vessel supporting section 8.

After that, the outer frame 5 and the inner frame 7 are respectively rotated by the motor 4 and the motor 6. The vessel 2 is rotated to have two rotation axes. While the vessel 2 is rotated, the precipitant evaporates inside the vessel 2. The evaporated precipitant diffuses into the protein solution put in the hollow 22a, through the gaps 22b provided for the button 22. When the precipitant diffuses into protein solution, the solubility of the protein in the protein solution decreases and the protein crystallizes. At this time, because the vessel 2 is rotated while the protein crystallizes, the protein crystal grows isotropically.

The following two reasons could be considered as the reasons why the protein crystal grows isotropically by rotating the vessel 2. The first reason is that it is estimated that the protein solution is gently moved so that the protein concentration becomes uniform. For the protein crystal to grow isotropically, it is necessary that protein concentration in the protein solution is uniform. By rotating the vessel 2, the protein solution is gently moved so that the protein concentration becomes uniform. Thus, the protein crystal is estimated to grow isotropically. The second reason is that the growing protein crystal is never settled in the bottom of the vessel which accommodates the protein solution and is never adhered to the wall thereof. If the protein crystal is settled at the vessel or adheres to the wall, the crystal growth is obstructed in the contact surface. Thus, the protein crystal could not be grown isotropically. It is estimated that the rotation of the vessel 2 prevents the precipitate of the protein crystal and adhesion to the wall, resulting in the isotropic growth of the protein crystal.

Moreover, by rotating the vessel 2, the larger protein crystal is obtained. This reason is not always clear. However, it is estimated that only a part of the nucleuses of the protein crystal grows selectively and the nucleus grows to the large protein crystal, when the vessel 2 is rotated.

It is desirable that the motor 4 and the motor 6 respectively rotate the outer frame 5 and the inner frame 7 such that the gravity is applied to the vessel 2 isotropically. That is, when the vessel 2 is observed for a sufficiently long time, it is desirable that the gravity is uniformly applied to the vessel 2 from all the directions. This grows the protein crystal more isotropically.

It is desirable that the motor 4 and the motor 6 respectively rotate the outer frame 5 and the inner frame 7, as described below. It is supposed that $\phi$ is an angle between an optional direction perpendicular to the rotation axis 4a and the outer frame 5. Also, it is supposed that $\theta$ is an angle between an optional direction perpendicular to the rotation axis 6a and the-inner frame 5. At this time, the outer frame 5 and the inner frame 7 are rotated such that the angles $\phi$ and $\theta$ meet the following differential equations.

$$\dot{\phi} = \frac{A}{|\sin\phi|} \quad (1)$$
$$\dot{\theta} = \frac{B}{|\sin\phi|}$$

It should be noted that the original values of $\phi$ and $\theta$ are optional. Also, A and B are selected so as not for 2 m/n to be an integer to the minimum n and m meeting a relation of A:B=n:m.

When the angles $\phi$ and $\theta$ are set to meet the differential equations (1), the gravity is isotropically applied to the vessel 2. The reason is described in Japanese Laid Open Patent Application (JP P2000-79900A) which was filed by the assignee of the present invention.

Subsequently, an example in which the protein crystal is grown by the protein crystallization apparatus in this embodiment is shown.

Lysozyme dissolving buffering solution in which lysozyme was dissolved was used as protein solution. The lysozyme concentration of the lysozyme dissolving buffering solution was 80 mg/ml. Acetic acid and sodium acetate were dissolved in the lysozyme dissolving buffering solution as the buffering agent. The concentrations of acetic acid and the sodium acetate were 50 mM, respectively. The lysozyme dissolving buffering solution was produced to have pH 4.7.

Sodium chloride dissolving buffering solution in which sodium chloride was dissolved was used as precipitant solution. The concentration of the sodium chloride was 1.0 M. Acetic acid and sodium acetate were dissolved in the sodium chloride dissolving buffering solution as the buffer agents. The concentrations of acetic acid and the sodium acetate were 50 mM, respectively. The sodium chloride dissolving buffering solution was produced to have pH 4.7.

The Lysozyme dissolving buffering solution was put into the hollow 22a of the button 22 by 20 μl. Moreover, the sodium chloride dissolving buffering solution was absorbed into the cellulose fiber 24 by 300 μl. The vessel 2 was sealed up by the seal 23 and was attached to the vessel supporting section 8.

The operation of the three-dimensional klinostat 1 was started and the growth of the lysozyme crystal was started. The outer frame 5 was rotated in the average rotation speed of about 1.5 rpm around the rotation axis 4a. The inner frame 7 was rotated in the average rotation speed of about 1.7 rpm around the rotation axis 6a. In this way, the vessel 2 is rotated to have two rotation axes such that the gravity is isotropically applied. The vessel 2 was kept at the constant temperature of about 20° C. while the vessel 2 was rotated. The rotation was continued for 90 hours. After that, the obtained lysozyme crystal was taken out.

As a contrast experiment, a similar experiment was carried out in the condition in which the vessel 2 was not rotated.

The crystal structure analysis such as the measurement of the size of the crystal, the outward appearance observation, the density measurement and the X ray diffraction was carried out to the obtained lysozyme crystal.

Figure 4A:
FIG. 4A is a surface observation photograph of lysozyme crystal grown under the condition that the vessel is rotated.
Figure 4B:
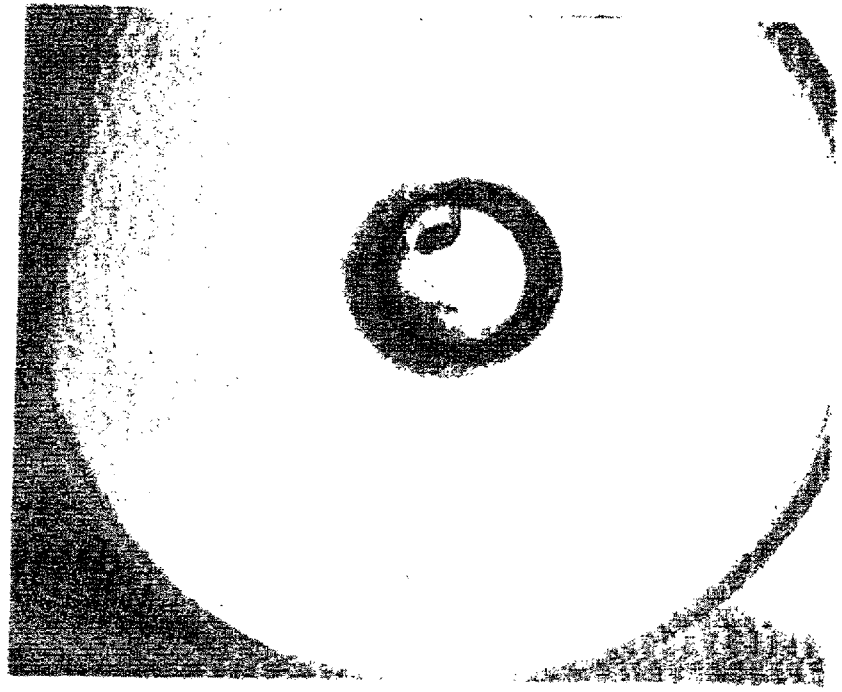
FIG. 4B is a surface observation photograph of lysozyme crystal grown under the condition that the vessel is not rotated.

It was found through the outward appearance observation that the more isotropic lysozyme crystal was obtained by rotating the vessel 2. FIG. 4A is the surface observation photograph of the lysozyme crystal which had grown under the condition that the vessel 2 was rotated. FIG. 4B is the surface observation photograph of the lysozyme crystal which had grown under the condition that the vessel 2 is not rotated. The lysozyme crystal which had grown under the condition that the vessel 2 was rotated had the smoother surface. This shows that the lysozyme crystal grows more isotropically by rotating the vessel 2.

Moreover, it found that the existence or non-existence of the rotation of the vessel 2 had an influence on the size of the lysozyme crystal, as a result of the measurement of the size of the crystal. The lysozyme crystals having the size larger than 200 μm and the lysozyme crystals having the size smaller than 20 μm were obtained under the condition that the vessel 2 was rotated. On the other hand, the lysozyme crystals with the size range of 50 μm to 100 μm were obtained under the condition that the vessel 2 was not rotated. This shows that only a part of the nucleus of the lysozyme crystals grows selectively and that the nucleus grows to the large lysozyme crystal when the vessel 2 is rotated.

As a result of the density measurement and crystal structure analysis, it was found that the existence or non-existence of the rotation of the vessel 2 does not influence in the density of the lysozyme crystal, the structure of the crystal grid, and the crystallite. FIG. 5 shows the characteristics of the obtained lysozyme crystals. The density of the lysozyme crystal was about 1.25 g/ml regardless of the existence or non-existence of the rotation of the vessel 2. It was found that the result of the X-ray analysis showed that the obtained lysozyme crystals had a tetragonal crystal structure and belonged to a point group $P4_32_12$ regardless of the existence or non-existence of the rotation of the vessel 2. Moreover, as a result of the X-ray analysis, the sizes of the unit cells were approximately equal to each other regardless of the existence or non-existence of the turn of the vessel 2. Moreover, as a result of the observation of the mosaic diffusion, it was found that a mosaic index was 0.2 and equal to each other. Moreover, an X ray was irradiated to the obtained lysozyme crystal to produce a Bragg's reflection. At this time, it was found that the maximum resolutions of any lysozyme crystals were equal to or more than about 1.4 Å and approximately equal to each other. Thus, it was found that the rotation of the vessel 2 had not adverse influence in the crystallite of the obtained lysozyme crystal.

The present invention provides the protein crystallization technology to promote the growth of the protein crystal.

Also, the present invention provides the protein crystallization technology in which it is possible to grow more isotropically the protein crystal.

What is claimed is:

1. A protein crystallizing method comprising the steps of:
   (a) providing a vessel to a vessel supporting section;
   (b) rotating said vessel supporting section around first and second rotation axes; and
   (c) growing a protein crystal while said vessel supporting section is rotated, wherein said vessel contains protein solution.

2. The protein crystallizing method according to claim 1, wherein said (b) rotating step comprises the steps of:
   rotating said vessel around said first rotation axis; and
   rotating said first rotating unit around said second rotation axis.

3. The protein crystallizing method according to claim 1, wherein said (b) rotating step comprises the step of:
   rotating said vessel supporting section to meet the following differential equations (1)

$$\dot{\phi} = \frac{A}{|\sin\phi|} \quad (1)$$

$$\dot{\theta} = \frac{B}{|\sin\phi|}$$

where θ is a rotation angle with respect to said first rotation axis and θ is an rotation angle with respect to said second rotation axis, and A and B are selected such that 2 m n, m and n being positive integers, is not an integer to minimum n and m in meeting a relation of A:B=n:m.

4. The protein crystallization method according to claim 1, wherein said (b) rotating step comprises the step of:
   rotating said vessel supporting section such that gravity is applied to said vessel isotropically.

5. The protein crystallization method according to claim 1, further comprising the step of:
   providing said vessel which comprises:
      a vessel section having an opening;
      a sealing section which seals said opening of said vessel section;
      an absorption member which is provided in said vessel section and in which precipitant solution is absorbed, precipitant evaporates from said absorption member and diffuses in an inside of said vessel section; and
      a button provided apart from said absorption member in said vessel section to hold said protein solution, and
   wherein said (c) growing step comprises the steps of:
      evaporating said precipitant from said absorption member;
      absorbing said precipitant by said protein solution; and
      precipitating said protein crystal.

6. A protein crystallization apparatus comprising:
   a vessel supporting section to which at least one vessel is detachably fixed; and
   a rotating unit which rotates said vessel supporting section around first and second rotation axes,
   wherein said vessel contains protein solution and a protein crystal grows while said vessel supporting section is rotated.

7. The protein crystallization apparatus according to claim 6, wherein said rotating unit comprises:

a first rotating unit which rotates said vessel around said first rotation axis; and a second rotating unit which rotates said first rotating unit around said second rotation axis.

8. The protein crystallization apparatus according to claim 7, wherein said first rotating unit comprises:
   an inner frame which supports said vessel supporting section; and
   a first motor which rotates said inner frame, and
   said second rotating unit comprises:
      an outer frame to which said first rotating unit is mounted; and
      a second motor which rotates said first rotating unit.

9. The protein cystallization apparatus according to claim 8, wherein said rotating unit rotates said vessel supporting section to meet the following differential equations (1), $$\dot{\phi} = \frac{A}{|\sin\phi|} \quad (1)$$

$$\dot{\theta} = \frac{B}{|\sin\phi|}$$

where θ is an angle between a direction perpendicular to said first rotation axis and said outer frame, and θ is an angle between a direction perpendicular to said second rotation axis and said inner frame, and A and B are selected such that 2 m/n, m and n being positive integers, is not an integer to minimum n and m meeting a relation of A:B=n:m.

10. The protein crystallization apparatus according to claim 6, wherein said rotating unit rotates said vessel supporting section such that gravity is applied to said vessel isotropically.

11. The protein crystallization apparatus according to claim 6, wherein said vessel comprises:
   a vessel section having an opening;
   a sealing section which seals said opening of said vessel section;
   an absorption member which is provided in said vessel section and in which precipitant solution is absorbed, precipitant evaporates from said absorption member and diffuses in an inside of said vessel section; and
   a button provided apart from said absorption member in said vessel section to hold said protein solution;
   said precipitant is absorbed by said protein solution and said protein crystal is precipitated.

12. A vessel used for protein crystallization comprising:
   a vessel section having an opening;
   a sealing section which seals said opening of said vessel section;
   an absorption member which is provided in said vessel section and in which precipitant solution is absorbed, precipitant evaporates from said absorption member and diffuses an inside of said vessel section; and
   a button provided apart from said absorption member in said vessel section to hold protein solution;
   wherein said precipitant is absorbed by said protein solution and protein crystal is precipitated.

13. The vessel according to claim 12, wherein said absorption member is provided in a lower portion of said vessel section, and said button is provided in an upper portion of said vessel section,
   said button has a plurality of flow paths from an upper surface thereof to a lower surface thereof, and said precipitant evaporates from said absorption member and diffuses into said protein solution through said plurality of flow paths.

14. The vessel according to claim 12, wherein said absorption member comprises a cellulose fiber.

15. The vessel according to claim 12, wherein said button has a hollow provided on an upper surface and said protein solution is held in said hollow.

* * * * *